United States Patent [19]

Braden et al.

[11] Patent Number: 4,753,061
[45] Date of Patent: Jun. 28, 1988

[54] METHOD OF AND APPARATUS FOR PACKAGING CHIP COMPONENTS

[75] Inventors: Denver Braden, San Marcos; Donald A. Bistline, Vista, both of Calif.

[73] Assignee: Electro Scientific Industries, Inc., Portland, Oreg.

[21] Appl. No.: 876,801

[22] Filed: Jun. 20, 1986

[51] Int. Cl.[4] .............................................. B65B 11/50
[52] U.S. Cl. ........................................ 53/471; 53/281; 53/493; 53/559
[58] Field of Search ................ 53/467, 471, 453, 454, 53/559, 560, 282, 281, 287, 553, 55, 493, 500, 73; 198/397, 380, 803.14, 803.15

[56] References Cited

U.S. PATENT DOCUMENTS

| | | | |
|---|---|---|---|
| 3,038,282 | 6/1962 | Hansen et al. | 53/560 X |
| 3,284,984 | 11/1966 | Cloud | 53/560 |
| 3,656,604 | 4/1972 | Sterling | 198/397 |
| 3,695,414 | 10/1972 | Wiesler et al. | 198/688.1 |
| 3,846,956 | 11/1974 | Johnson | 53/453 |
| 4,479,573 | 10/1984 | Ackley, Sr. et al. | 198/397 X |
| 4,571,924 | 2/1986 | Bahrani | 53/559 X |

Primary Examiner—James F. Coan
Attorney, Agent, or Firm—John J. Murphey

[57] ABSTRACT

A method of loading chip components orientation-specific into a carrier tape that itself comprises a narrow strip of diaphanous material having a series of depressions embossed therein comprising the steps of moving a series of open-ended recesses, sized and shaped to receive a single chip component in a specific orientation, upwardly through a loose mass of chip components at a speed that is continually interrupted with real time pauses and ultimately transferring the chip components into conjunctive registry with the tape embossments and an apparatus therefor.

17 Claims, 6 Drawing Sheets

METHOD OF AND APPARATUS FOR PACKAGING CHIP COMPONENTS

BACKGROUND OF THE INVENTION

1. Field of the Invention

This invention relates to the field of microcircuitry chip components. More particularly, it relates to a method of and an apparatus for packaging said components in specific orientation within a carrier tape. Such a tape provides efficient and safe handling and transportation as well as speed and accuracy in unpacking and later placement of the components on an electronic circuit board.

2. Description of the Prior Art

In recent past, there has been substantial development in the fabrication of circuit boards used in various electronic devices such as computers. While previously, microcircuit components had been attached to a circuit board by inserting their connecting wires through small holes in the board and soldering them to conductor leads, many chip components are now fabricated such that they can be directly soldered to the circuit board free of any wires or other elongated connectors.

Components such as capacitors, resistors, diodes, chip form LEDs, multilayer inductors in chip form, small outline transistors (SOT's) and film capacitors are now fabricated in chip form with a metal band about each end thereof that is smooth and planar to the body thus enabling them to be laid flat on the circuit board and soldered thereto. By this means, the time consumed in inserting the wires through the holes and thereafter heating and soldering them to the connectors is eliminated. Also, unwanted electrical resistance from poor heating, flaws in the connection wires and oil from human contact are eliminated so that the speed at which these devices is handled is greatly reduced thus increasing productivity.

These chip components may vary in size from a length of about 0.080 inches to 0.240 inches (2 mm to 6 mm), a width of about 0.040 inches to 0.120 inches (1 mm to 3 mm) and a thickness of about 0.010 inches to 0.080 inches (0.25 mm to 2 mm). In many instances the attachment bands completely encircle the component body so that they are attachable along both flattened faces thereof.

It is known in the art to deal with small items by packaging and storing them between the mating surfaces of elongated strips of tape, see U.S. Pat. No. 2,885,849. In some cases, one or both of the tapes may undergo a preliminary embossing operation that creates a series of pockets or embossments spaced along the tape into which the small item or component may be sealed with a flat cover tape, see U.S. Pat. No. 3,284,984.

To date, the prior art has either loaded these small items into the tape by dropping them out of a hopper onto the tape and into the embossments, see U.S. Pat. No. 3,846,956 or by having a suction nozzle pick up each item, one at a time, from a source and transfer it to the embossment area where the vacuum is released and the item dropped into the embossment. In the first method, there is no practical way to control orientation of the items in the embossments and, by random action, they will take on mixed orientations, some being aligned lengthwise with the tape and some transverse thereto. In addition, severe vibration of these components may cause cracks to develop in their ceramic substrate or denting or scratching of the ceramic face or metal bands that will alter their electronic characteristics and cause damage or loss of quality to the circuit board.

In the second method, significant real time is consumed in picking up, transporting and setting down the item so that productivity is greatly limited. It is necessary for achieving low fabrication costs of electronic circuit boards that the chip components be rapidly loaded into a carrier tape in specific orientation so that during fabrication they may be rapidly unloaded and conveniently placed directly onto the circuit board for attachment thereto without the necessity of turning or rotating them. It is further necessary that the carrier tape be totally and completely filled with chip components. With the large amount of components used in each circuit board and the high speed automation employed in placing each one in a specific location for connection, each empty carrier embossment represents lost machine fabrication time and possibly further time-consuming assembly involving costly hand operations. To date, maximum loading rates of specifically oriented microchip components into an embossment-type carrier tape is achieved by use of the vacuum nozzle method, previously described, with obtainable rates in the area of 10,000 to 30,000 loadings per hour.

SUMMARY OF THE INVENTION

This invention is a method of loading chip components into an embossment-type carrier tape in specific orientation at rates approaching 120,000 units per hour or 2,000 units per minute. Further, this invention includes an apparatus for carrying out this method and for conveniently handling large volumes of chip components and loading them into these embossment tapes.

This invention also provides an apparatus having a series of chip component recesses that are passed in an upward direction through a mass of loose chip components. These recesses are amenable to accepting the chip components in a specific orientation whereby the components are urged into the recesses by interrupting the travel of the recesses in equally spaced real-time pauses from about 5 to about 35 milliseconds. By the combination of passing the recesses carefully through the source of components and interrupting the travel of the recesses the components are caused to migrate quickly and positively in specific orientation into the recesses. Further, this invention includes the provision of returning unseated components back to the chip component source to prevent scattering of loose components about the apparatus and to save costs. The chip component-filled recesses are thereafter brought into registration with embossments in the carrier tape and the components transferred thereto by means that prevent rotation, twisting, turning or otherwise disorientation of the component. Means are provided to ensure a fully filled series of embossments on the carrier tape by advancing loading activity upon the occurrence of an empty recess so that the next component-filled recess fills the next empty embossment. By this invention, carrier tapes may be loaded at high speed with specifically oriented chip components in a method and with an apparatus that insures total fillment of the carrier tape and virtually hands-free operation. These chip components may thereafter be conveniently handled, stored, transported and unloaded to place the specific component in a specific orientation on the circuit board for immediate attachment thereto.

Accordingly, the main object of this invention is a method of and apparatus for loading chip components in specific orientation within embossments of a carrier tape under high speed conditions heretofore unachievable in the art. Further objects include means for insuring the rapid and total fillment of the carrier tape with chip components, means for insuring that chip components do not move or otherwise disorient between loading and unloading of the tape, and a method and apparatus amenable to loading chip components of various sizes and shapes. These and other objects of the invention will become more apparent upon reading the Description of the Preferred Embodiment taken together with the Drawings attached hereto. The scope of the protection claimed by the inventors may be obtained from a fair reading of the Claims that conclude this specification.

DESCRIPTION OF THE PREFERRED EMBODIMENT

Figure 1:
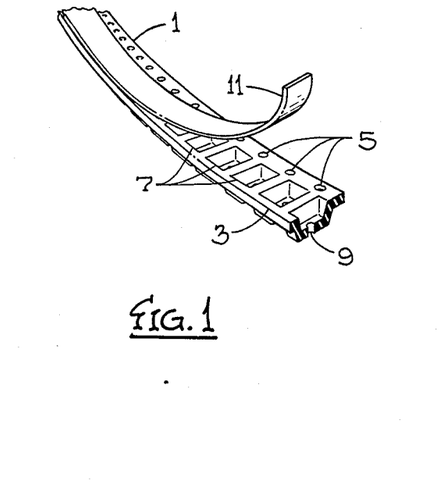
FIG. 1 is a perspective view of a typical embossment-type tape and cover tape loaded by this invention.

In FIG. 1, the embossment-type carrier tape utilized in this invention is generally shown at 1. Tape 1 comprises a diaphanous flexible carrier tape 3 generally less than 1 mm in thickness and having a width varying from about 8 mm to about 56 mm with a series of sprocket holes 5 formed along at least one side thereof, for engagement with various drive means, and a series of pocket-like embossments 7 formed therealong in intervals ranging from 4 mm to 56 mm on center depending upon the width of the film. The size and shape of embossment 7 depend upon the size and shape of the chip component to be packaged therein. They are generally rectangular and usually range from 2 mm to 8 mm in length, 2 mm to 8 mm in width and 1 mm to 4 mm in depth. It is generally required that the size of the embossment should be no larger than 0.2 mm beyond the dimensions of the chip component to be packaged therein to limit movement and rotation of said component sealed therein to less than 20°. An aperture 9 is formed in the base of each embossment 7 to provide a passageway through which to draw a vacuum for holding a chip component therein during a portion of the loading sequence. A diaphanous cover tape 11 having a width slightly beyond the width of the embossment and ranging from about 0.1 mm to about 0.3 mm in thickness is later applied over embossments 7 to seal the loaded chip components therein.

Figure 2:
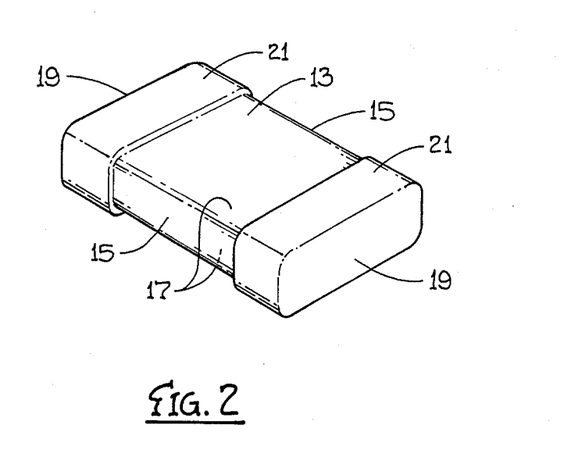
FIG. 2 is a close-up view of a typical chip component which is handled by the method and apparatus of this invention.

FIG. 2 shows a typical chip component 13 that is packaged by the method and apparatus of this invention. Chip component 13 comprises a flattened body bounded by a pair of generally parallel sides 15, a pair of mutually parallel, spaced-apart front and rear faces 17 and a pair of spaced-apart opposed terminal end walls 19. Adjacent each end wall 19 is a narrow metal band 21 for soldering or otherwise attaching component 13 to the metal substrate of a circuit board.

Figure 3:
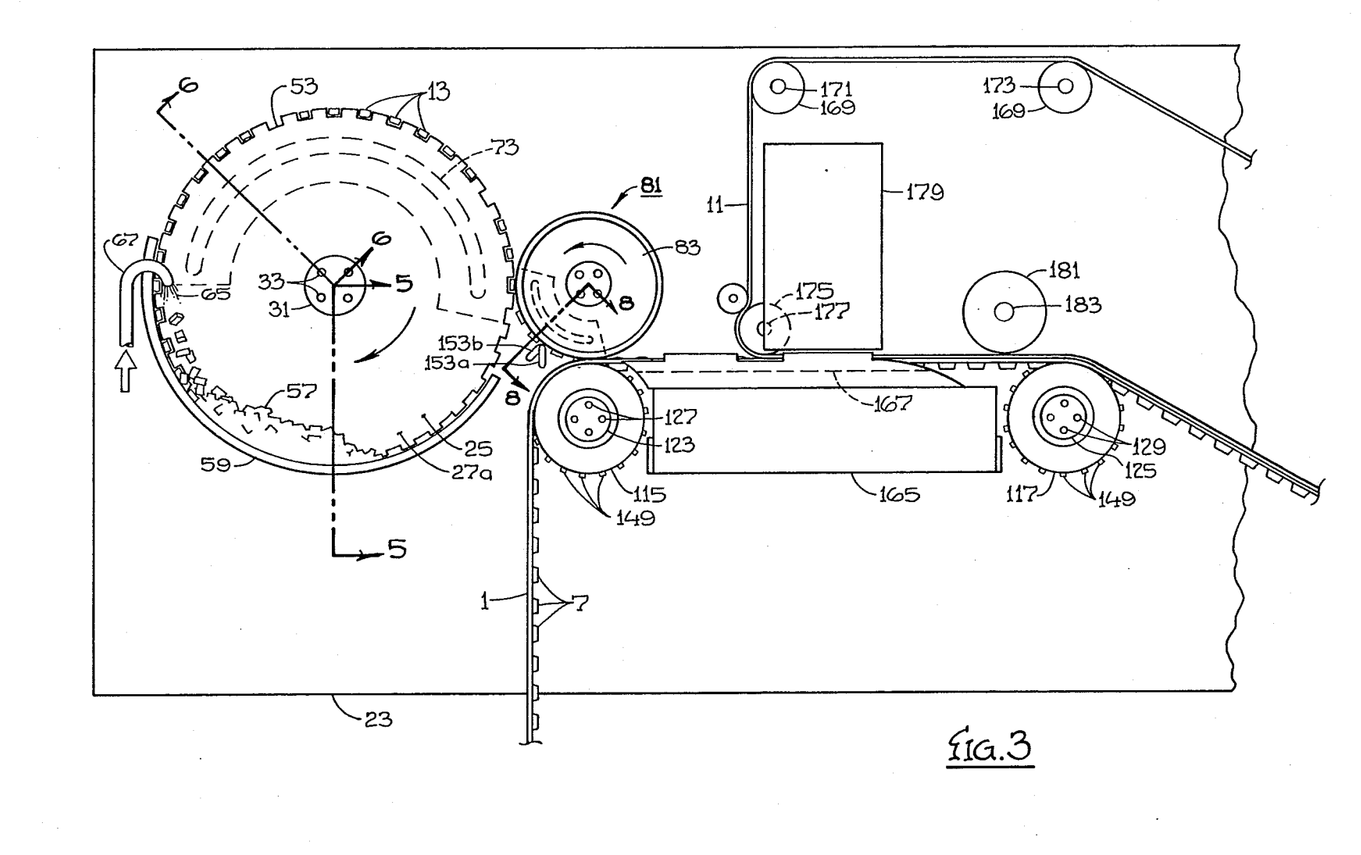
FIG. 3 is a front elevational view of the preferred embodiment of the apparatus of this invention.
Figure 4:
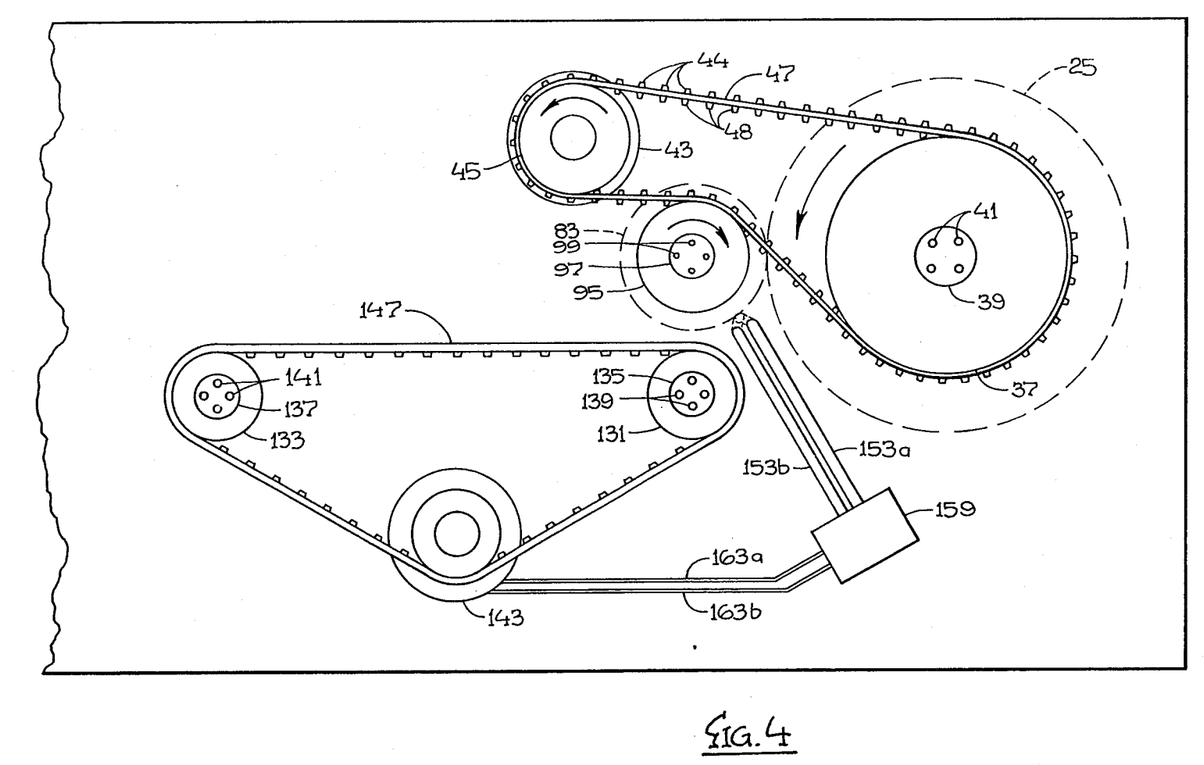
FIG. 4 is a rear elevational view of the embodiment shown in FIG. 3.

FIG. 3 shows a front view of the preferred embodiment of the apparatus of this invention; FIG. 4 shows the rear view of the same embodiment. There is first provided an upright planar support 23 upon which all other components are mounted. While support 23 may be arranged vertically, it is preferred that it be inclined slightly rearward for reasons hereinafter set forth.

A relatively thin chip component pick up wheel 25 of a diameter of about 10 inches and bounded by front and rear planar surfaces or faces 27a and 27b is mounted on a rotatable journaled shaft 29 and held thereto by a cap 31 and screws 33. Shaft 29 passes through a bearing 35, mounted in planar support 23, and is connected to a tooth-type drive wheel 37 through another cap 39 and screws 41. Drive wheel 37 is driven by a first control motor 43, such as a direct current stepping motor, containing a tooth-laden drive wheel 45 through an enclosed, looped belt 47 that surrounds wheels 37 and 45 and that contains a series of accurately spaced-apart teeth 48, along both the inside and outside of said loop, said inside teeth 48 interacting with the teeth on drive wheels 37 and 45 to provide accurate and controlled drive power therebetween (see FIG. 4).

Figure 7:
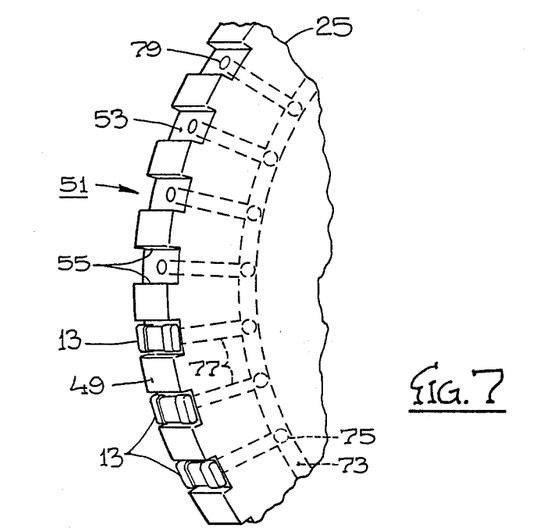
FIG. 7 is a close-up view of a portion of the outer edge of the chip component receiving wheel showing how the chip components are held in specific orientation within the recesses.

Wheel 25 is conveniently made of a hard, material such as metal, plastic or glass-filled resin and contains about its perimeter 49 a means 51 for receiving chip components in specific orientation. As shown in FIG. 7, means 51 comprises a series of open ended recesses 53 arranged transverse to the plane of wheel 25 and spaced uniformly about perimeter 49. Each recess 53 is defined by a pair of upstanding side walls 55. The length and width of recess 53 is held slightly greater than the similar dimensions of chip component 13 to restrict movement of said component after receipt therein. As shown, recesses 53 are arranged to receive components 13 transverse or cross-ways to the plane of wheel 25 with the width of the recess slightly larger than the width of chip component 13 but less than the length of said component.

Figures 5, 6:
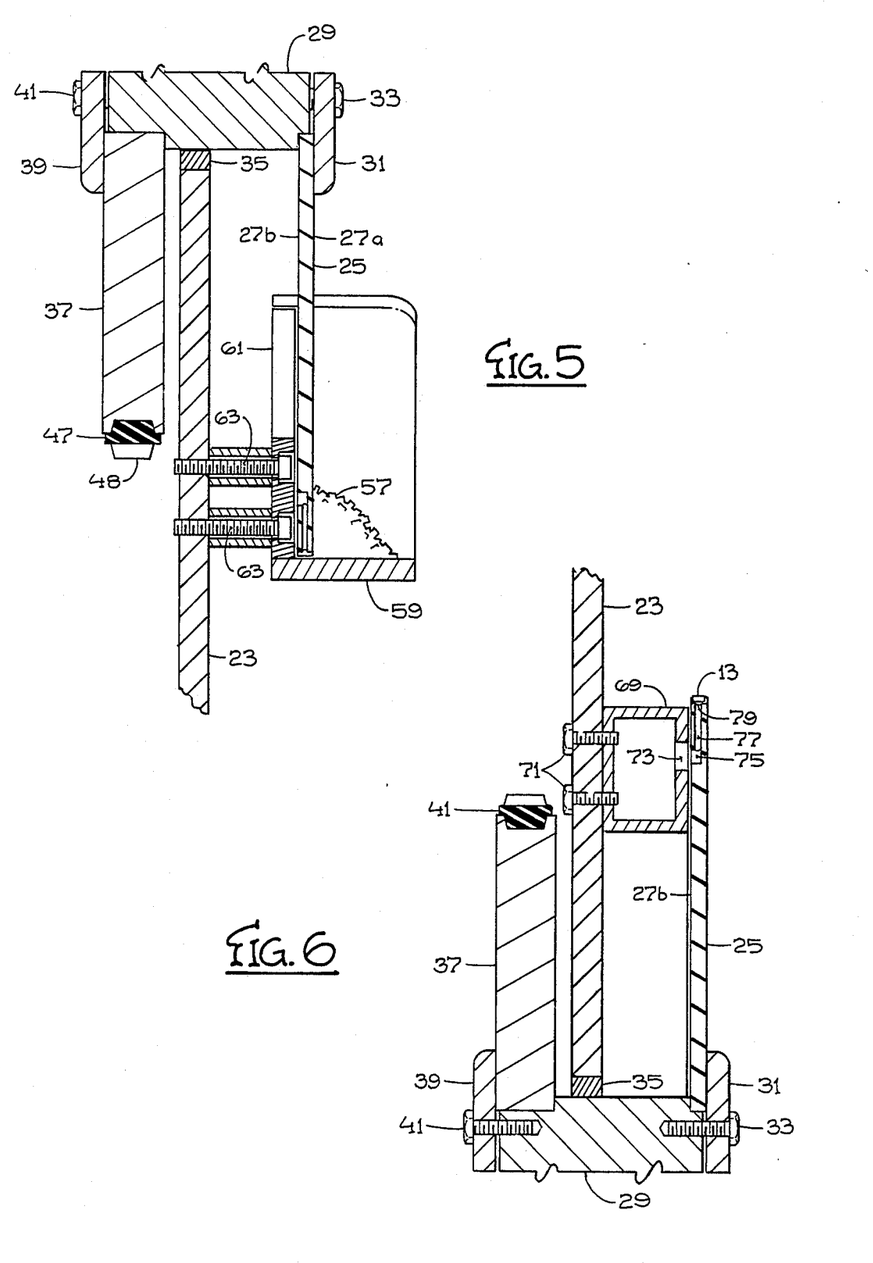
FIG. 5 is a sectional view of a portion of the chip component receiving wheel and related apparatus taken along lines 5—5 in FIG. 3.
FIG. 6 is another sectional view of a portion of the chip component receiving wheel and related apparatus taken along lines 6—6 in FIG. 3.

As shown in FIGS. 3 and 5, a loose mass of chip components is maintained as a loading source 57 on a tray 59, attached to a backing plate 61, mounted outward from planar support 23 by screws 63. With the backward inclination of support 23, tray 59 may be normal thereto and yet fully support said source 57 thereon. Backing plate 61 is arranged close to rear planar surface 27b to prevent the chip components from sliding all the way through and out of recesses 53 but far enough from surface 27 to permit unrestricted free rotation of wheel 25. Tray 59 is likewise arranged closely about the lower portion of wheel perimeter 49 to help retain the chip components in recesses 53 but far enough from perimeter 49 to permit unrestricted free rotation of wheel 25. As wheel 25 rotates in the direction of the arrow (clockwise), pick up means 51 is passed through loading source 57 in an upwardly moving recycling path.

To achieve high loading rates at a high rate of recess filling without damage to the components, receiving wheel 25 is halted, by control motor 43 during its rotation for a period from about 5 to about 35 milliseconds as each recess 53 reaches any given point. This delay or "dwell time" appears to cause chip components to move swiftly into said recesses without tumbling over each other. This use of dwell time, as opposed to severe vibration, has surprisingly shown to cause a smoother and more positive travel of the chip components from source 57 into recesses 53 without damaging interaction between the components. The actual dwell time is related and dependent upon the size, shape and weight of the chip component being loaded. At a diameter of 10 inches and a rotational speed of 10 rpm, wheel 25 has been able to achieve loading rates of upwards of 120,000 components per hour or 2,000 per minute. This represents a four fold jump in loading rate over existing methods and apparatuses. Combining this with the specific orientation loading feature, it is clear that this method and apparatus represent a significant advancement in chip component-loading technology.

After component-specific pick up means 51 clears chip component source 57, it encounters a rearwardly directed air stream 65, issuing from a nozzle 67, directed against wheel front face 27a and generally tangential to wheel perimeter 49 and tray 59. Said air stream 65 completes seating of partially seated chip components 13 by driving them the rest of the way into recesses 53 and dislodges accumulated, non-seated chip components and blows them back down into chip component source 57 to both recover unpackaged components and to prevent them from interfering in later packaging operations.

As wheel 25 leaves exposure to air stream 65, a partial vacuum is induced along perimeter 49 to retain chip components 13 in recesses 53. As shown in FIG. 6, a first enclosed hollow vacuum manifold 69 is mounted on planar support 23 by screws 71 behind wheel 25, annular and adjacent to a portion of perimeter 49, and in close contact with wheel rear face 27b. A slot 73 is formed in manifold 69 adjacent wheel rear planar surface 27b and is arranged to communicate with a series of apertures 75 formed in rear surface 27b and equally spaced thereabout, that communicate with radial passageways 77 and connecting apertures 79, the latter formed in the base of each of wheel recesses 53 (see FIG. 7). When a partial vacuum is drawn inside manifold 69 from a remote source (not shown), said vacuum is communicated via slot 73, apertures 75, passageways 77 and apertures 79 to hold or retain loaded chip components 13 in recesses 53. The specifically oriented chip components 13, held in recesses 53 by vacuum, are thereafter transferred into registry with embossments 7 of carrier tape 1. This is achieved by the use of communication means 81.

Figure 8:
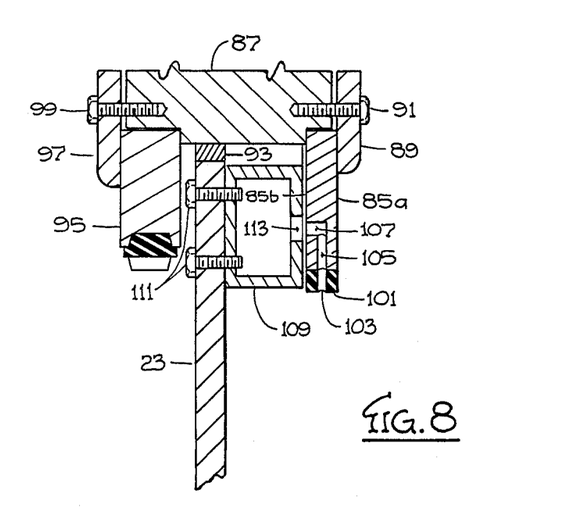
FIG. 8 is a sectional view of a portion of the transfer wheel and related apparatus taken along lines 8—8 in FIG. 3.
Figure 9:
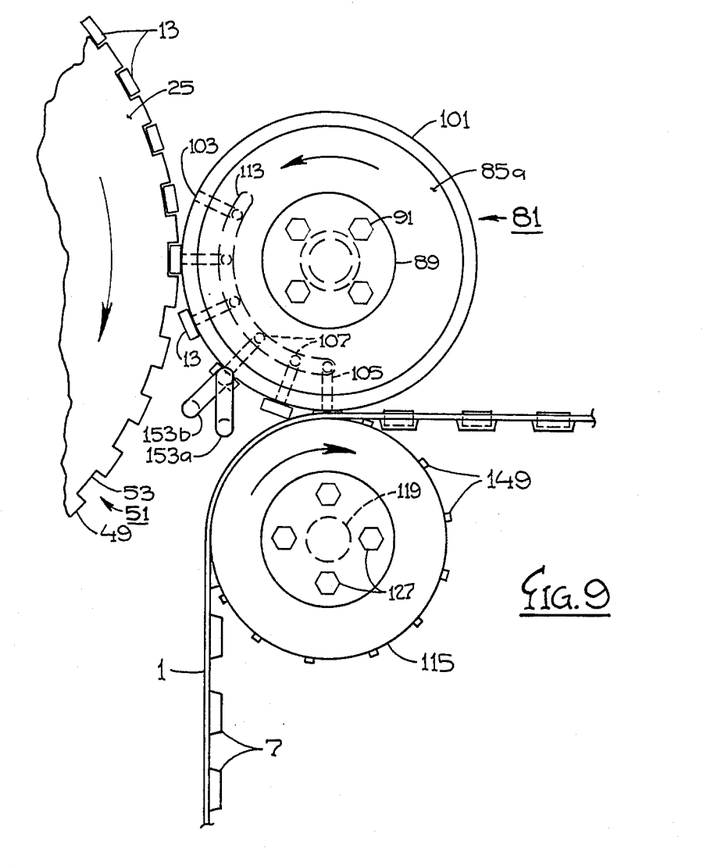
FIG. 9 is a close-up view of the interaction between the chip component receiving wheel, the transfer wheel and one of the tape drive wheels showing how the chips are transferred in specific orientation.

As shown in FIGS. 3, 8 and 9, communication means 81 comprises a smaller diameter, flat-edged transfer wheel 83, bounded by front and rear faces 85a and 85b, mounted in planar alignment and in near-tangential contact with wheel 25 on a rotatable journaled shaft 87 and held thereto by cap 89 and screws 91. Shaft 87 passes through a bearing 93, mounted in planar support 23, and is connected to a tooth-type drive wheel 95 through another cap 97 and screws 99. As shown in FIG. 4, the teeth of drive wheel 95 interact with teeth 48 along the outside of looped drive belt 47, along a portion of contact therebetween, to rotate drive wheel 95 in the opposite direction from drive wheel 37. Wheel 83 contains a smooth perimeter 101 that is made slightly resilient and with a surface friction constant that will aid in holding chip components thereagainst. A series of closely-spaced apertures 103 are formed along perimeter 101 that communicate through radial passageways 105 with a series of apertures 107 that open outward through rear wheel surface 85b.

A second enclosed hollow vacuum manifold 109 is mounted on planar support 23 by screws 111, behind transfer wheel 83, annular and adjacent to a portion of wheel perimeter 101, and in close contact with rear wheel face 85b. A slot 113 is formed in manifold 109 adjacent rear face 85b and is arranged to communicate with apertures 107 as wheel perimeter 101 passes from near-tangential contact at 114 with pick-up wheel perimeter 49 to the next loading operation.

As pick-up wheel 25 is driven interruptedly in a clockwise direction, transfer wheel 83 is driven in the opposite direction and adapted to proceed at a controlled peripheral speed and in the same interrupted manner. As shown in FIG. 3, each component-filled recess 53 reaches near tangential contact at 114 with transfer wheel perimeter 101, first vacuum manifold communication slot 73 terminates behind pick-up wheel 25 and second vacuum manifold communication slot 113 begins behind transfer wheel 83 so that chip component 13 is released from its vacuum-imparted grip in recess 53 and moved by newly-induced vacuum across point 114 and against transfer wheel perimeter 101. Because both wheels 25 and 83 undergo the same rotational interruption at the same instant, and remain stationary during the same dwell period, chip components 13 are transferred from recesses 53 to perimeter 101 under rest conditions at 114. Such a method of transfer insures that the specific orientation of said components will be retained. The combination of slight resiliency and frictional constant along perimeter 101 insures the integrity of oriented chip components 13 thereagainst notwithstanding the absence of recessed side walls 55.

Simultaneously with the transfer of chip components 13 from pick up wheel recesses 53 to transfer wheel smooth perimeter 101, the empty embossment-type carrier 1 is introduced from a supply roller (not shown) to a pair of spaced-apart tape drive wheels 115 and 117 (see FIG. 3). Wheels 115 and 117 are mounted respectively on rotatable journaled shafts 119 and 121 by caps 123 and 125 and screws 127 and 129. Shafts 119 and 121 pass through bearings (not shown) mounted in planar support 23 and are connected to respective tooth-type drive wheels 131 and 133 by caps 135 and 137 and screws 139 and 141 (see FIG. 4). Drive wheels 131 and 133 are driven by a second control motor 143, containing a tooth-laden drive wheel 145 similar to first control motor 43, through a looped drive belt 147 that contains spaced-apart teeth that interact with the teeth on drive wheels 131, 133, and 145. Each said tape drive wheels 115 and 117 contain a series of outwardly radially directed drive sprocket pins 149 spaced equally about their respective perimeters to engage sprocket holes 5 of said tape 1 when it is stretched thereover and held in mutual registration. Tape drive wheel 115 is arranged to rotate to bring tape 1 into near-tangential contact with transfer wheel perimeter 101 at the lowermost portion of said transfer wheels' travel. The smaller diameter of tape drive wheel 115, relative to transfer wheel 83, permits embossment 7 to be quickly brought into close registration with transfer wheel perimeter 101. As transfer wheel 83 rotates in a counterclockwise direction (see arrow) perimeter 101 advances chip components 13 toward tape 1.

Because of the action of first control motor 43, said components are indexed into conjunctive alignment with empty embossments 7 and fed into partial reception therein. At this point, second vacuum manifold slot 113 terminates so that the previously induced partial vacuum, holding chip components 13 to wheel perimeter 101 is relieved to allow said components to be placed fully into embossment 7.

Figure 10:
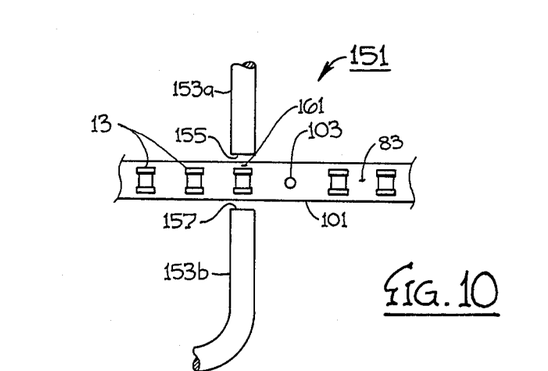
FIG. 10 is a close-up view of the monitor means provided to insure complete filling of the tape.

To insure total fillment of carrier tape 1, FIG. 10 shows monitor means 151 employed to determine the existence of absent chip components over their respective vacuum apertures 103 on perimeter 101 of transfer wheel 83. Means 151 is shown to comprise a pair of optic fibers 153a and 153b whose spaced-apart ends 155 and 157 are set facing each other on opposite sides of transfer wheel perimeter 101 between wheel 25 and tape drive wheel 115. A light is transmitted from a source 159 (see FIG. 4) along fiber 153a to fiber end 155 where it exists into an inspection area 161 on wheel perimeter 101. Each time a chip component 13 is indexed into said inspection area 161, and remains there during the dwell time, the light beam is interrupted. Upon this interruption, controls are employed to permit this particular chip component to later index with an empty embossment 7 that is supported on the perimeter of tape drive wheel 115. Should a chip component be missing from its intended position on transfer wheel perimeter 101 when it indexes into inspection area 161, light source 159 will shine across the inspection area into optic fiber end 157 and will send a command from source 159 via conductors 163a and 163b to control motor 143 to cause a delay in advancement of embossment 7 until the next indexed chip component is presented. This insures total fillment of each embossment of carrier tape 1. As shown in FIG. 3, after being totally filled, carrier tape 1 proceeds from drive wheel 115 toward drive wheel 117. In doing so, carrier tape 1 passes over a third enclosed hollow vacuum manifold 165, positioned under carrier tape 1, as it passes from drive wheel 115 to drive wheel 117. Vacuum manifold 165 contains a slot 167 along the upper surface thereof in which filled embossments 7 ride as tape 1 moves therealong. A partial vacuum is induced in manifold 165 from a remote source (not shown) that pulls down on chip components 13 through tape aperture 9 to retain them in embossments 7.

Also during travel from drive wheel 115 to drive wheel 117, an elongated strip of cover tape 11 is drawn from a remote source (not shown) through a pair of first guide rollers 169, rotatably mounted on planar support 23 by shafts 171 and 173, and directed on top of and in alignment with tape 1 and over filled embossment 7 by a second guide roller 175, also mounted on planar support 23 by a shaft 177, and heat sealed thereto by heated sealer means 179. Tape 1 is kept under controlled tension by a pressurized idle tension roller 181, mounted on planar support 23 by shaft 183. The fully filled carrier tape, containing chip components in consistent specific orientation in sealed embossments 7, is thereafter directed to a wind up wheel and cutter (not shown).

What is claimed is:

1. A method of loading chip components orientation-specific into a carrier tape comprising the steps of:
   (a) moving a first elongated strip of carrier tape, said tape having a series of embossments formed therein at a uniform spacing therealong, along a controlled path;
   (b) moving a series of open-ended recesses, which are sized and shaped to receive a single chip component in a specific orientation, in an upwardly moving recycling path through a location containing a loose mass of said components from a point remote from said tape into conjunctive rescess-to-embossment registration therewith, at a speed that is continuously interrupted with real-time pauses of from about 5 milliseconds to about 35 milliseconds and equal to the speed of said carrier tape;
   (c) directing an air stream tangential to said recesses in the opposite direction of recess travel to complete seating of components therein and to return unseated components to said loose mass location;
   (d) inducing a partial vacuum at the bottom of each recess, following exposure to said air stream, and along a portion of travel toward the recess-to-embossment registration;
   (e) transferring said seated chip components into conjunctive registry with said embossments for deposit therein; and,
   (f) moving a second elongated strip of tape at the same speed and into contact with and covering said embossments in said first strip of tape following deposit of each component in an embossment and sealing the strips of tape together over each pocket.

2. The method of claim 1 wherein said embossments in said first strip of tape have apertures formed therein.

3. The method of claim 1 wherein said recesses are sized to receive the chip component with its longest dimension transverse to the direction of travel of said recycle path.

4. The method of claim 1 wherein said recesses pass across an inclined surface, during movement through said location containing said loose mass of chip components, to permit said components to migrate downward across said wall, under the influence of gravity, toward said moving recesses.

5. The method of claim 1 wherein the step of transferring said seated chip components into conjunctive registry with said embossments includes the steps of moving said chip components, seated in said series of recesses, into near-tangential contact with a surface moving in the same interrupted manner and simultaneously releasing the partial vacuum induced in the base of each said recess and inducing a similar partial vacuum in said moving surface, to transfer said chip components from said recesses to said surface in spaced-apart, orientation-specific position thereon during the interrupted portion of travel followed by the step of bringing said chip components into conjunctive registration with said embossments.

6. The method of claim 5 wherein said step of bringing said chip components into conjunctive registration with said embossments is followed by the step of inducing a partial vacuum in said embossment to transfer said chip component from said surface into said embossment.

7. The method of claim 5 including the step of providing means for determining the absence of any chip component in a prearranged location along said surface and, upon such a determination, discontinuing the advancement of an embossment in said tape, so that a chip component may advance to the next embossment for deposit therein to provide a fully-filled carrier tape.

8. A method of loading chip components orientation-specific into a carrier tape comprising the steps of:
   (a) moving a first elongated strip of carrier tape, said tape having a series of embossments formed therein at a uniform spacing therealong, along a controlled path;
   (b) moving a series of open-ended recesses, which are sized and shaped to receive a single chip component in a specific orientation, in an upwardly moving recycling path through a location containing a loose mass of said components from a point remote from said tape into conjunctive recess-to-embossment registration therewith, at a speed that is continuously interrupted with real time pauses from about 5 milliseconds to about 35 milliseconds and equal to the speed of said carrier tape;
   (c) directing an air stream tangential to said recesses in the opposite direction of recess travel to complete seating of components therein and to return unseated components to said loose mass location;
   (d) inducing a partial vacuum at the bottom of each recess following exposure to said air stream along a portion of recess travel toward the recess-to-embossment registration;
   (e) moving said chip components, seated in said series of recesses, into contact with a slightly resilient frictional surface arranged in near tangential contact therewith, and, during said interrupted travel, simultaneously releasing the partial vacuum induced in the base of each said recess and inducing a similar partial vacuum in said moving surface, to transfer said chip components from said recesses to said surface in spaced-apart, orientation-specific position thereon; and,
   (f) moving said chip components into conjunctive registration with said embossments and simultaneously releasing the partial vacuum induced on said surface to transfer said chip components from said surface into said embossments.

9. The method of claim 8 including the step of providing means for determining the absence of any chip component in prearranged location along said surface and, upon such a determination, discontinuing the advancement of an embossment in said tape, so that a chip component may advance to the next embossment for deposit therein to provide a fully-filled carrier tape.

10. An apparatus for loading chip components orientation-specific into an embossment-type carrier tape comprising:
    (a) a generally upright support;
    (b) a planar chip component receiving wheel mounted for rotation about an inclined axis on said support;
    (c) means adjacent the perimeter of said wheel for picking up chip components in specific orientation from a loading source comprising a loose mass of chip components supported adjacent thereto;
    (d) means for rotating said wheel and pick-up means at a speed that is continually interrupted in real time pauses from about 5 milliseconds to about 35 milliseconds to allow the chip components to enter said pick-up means;
    (e) means for transferring said orientation-specific chip components into conjunctive registration into the embossments of a carrier tape; and,
    (f) means for sealing a cover tape over said embossments.

11. The apparatus of claim 10 wherein said means for picking up chip components from said loading source comprise a series of open-ended recesses arranged transverse to the plane of said chip component receiving wheel and spaced uniformly about the perimeter thereof, each said recess defined by a pair of spaced-apart side walls and having a length and width slightly greater than the similar dimensions of the chip component to be picked up therein.

12. The apparatus of claim 10 wherein the width of said recess is slightly greater than the width of said chip component but less than the length of said component to insure orientation-specific receipt therein.

13. The apparatus of claim 10 wherein said means for transferring said orientation-specific chip components into conjunctive registration into the embossments of a carrier tape comprise:
    (a) means for providing a partial vacuum in said recesses to retain said chip components therein;
    (b) a flat-edged transfer wheel, mounted in planar alignment and in near-tangential contact with said chip component receiving wheel and arranged for rotation in the opposite direction thereof and at a similiarly continuously interrupted speed; and,
    (c) means for providing a partial vacuum in the perimeter of said transfer wheel from its near tangential contact point with said chip component receiving wheel to conjunctive registration with the embossments of the carrier tape.

14. The apparatus of claim 13 further including a pair of spaced-apart carrier tape drive wheels, mounted for rotation on said support and having a series of outwardly radially directed sprocket engaging pins spaced equally about their respective perimeters for engagement with sprocket holes contained in the carrier tape, one of said carrier tape drive wheels arranged to rotate into near-tangential contact with said transfer wheel perimeter for bringing the carrier tape embossments into conjunctive registration with the chip components specifically oriented about said perimeter of said transfer wheel.

15. The apparatus of claim 13 including means for inducing a partial vacuum in said transfer wheel perimeter to aid in retaining the specifically-oriented chip components thereagainst.

16. The apparatus of claim 10 further including a nozzle arranged to direct a stream of air against said chip component receiving wheel and tangential to said perimeter thereof to seat partially seated chip components in said recesses and dislodge accumulated, non-seated components and return them to said chip component loading source.

17. The apparatus of claim 13 further including means for determining the absence of any chip component in prearranged location along said perimeter of said transfer wheel comprising a pair of optic fibers mounted on opposite sides of said transfer wheel perimeter and terminating in a pair of mutually spaced-apart ends, a steady light from a source arranged to pass through one said end and means operatively connected to said other optic fiber to cause advancement of said transfer wheel to the next component-filled space therealong upon receipt of said light from said light source during said real time pause to insure that a chip component is indexed in conjunctive registration to the next empty carrier tape embossment.

* * * * *

UNITED STATES PATENT AND TRADEMARK OFFICE
CERTIFICATE OF CORRECTION

PATENT NO. : 4,753,061

DATED : June 28, 1988

INVENTOR(S) : Denver Braden and Donald A. Bistline

It is certified that error appears in the above-identified patent and that said Letters Patent is hereby corrected as shown below:

```
In Column 1,    line 56, delete "either".

In Column 1, line 57, after "tape" insert --either--.

In Column 2, line 15, change "amount" to --number--.

In Column 2, line 23, change "is" to --are--.

In Column 2, line 55, change "otherwise" to --other--.

In Column 3, line 62, change "They" to --The embossments--.

In Column 4, line 42, after "hard" delete ",".

In Column 5, line 10, after "halted" delete ",".

In Column 7, line 17, after "101" insert --,--.

In Column 7, line 29, change "exists" to --exits--.

In Column 8, line 15, change "rescess" to --recess--.
```

Signed and Sealed this

Sixth Day of December, 1988

Attest:

DONALD J. QUIGG

*Attesting Officer*   *Commissioner of Patents and Trademarks*